(12) United States Patent
Chae et al.

(10) Patent No.: US 7,743,671 B2
(45) Date of Patent: Jun. 29, 2010

(54) FLUID PRODUCTION COMPUTATION APPARATUS USING ELECTROMAGNETIC INDUCTION THEORY AND FLUID PRODUCING APPARATUS CAPABLE OF COMPUTING FLUID PRODUCTION

(75) Inventors: Kyoung-Soo Chae, Suwon-si (KR); Jae-Hyuk Jang, Seongnam-si (KR); Jae-Hyoung Gil, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 321 days.

(21) Appl. No.: 12/007,595

(22) Filed: Jan. 11, 2008

(65) Prior Publication Data

US 2008/0265875 A1   Oct. 30, 2008

(30) Foreign Application Priority Data

Apr. 25, 2007   (KR) .................. 10-2007-0040539

(51) Int. Cl.
*G01F 1/58* (2006.01)
*G01N 27/74* (2006.01)

(52) U.S. Cl. ................... 73/861.12; 324/204
(58) Field of Classification Search ............. 204/238; 324/204; 73/861.12; 426/66; 239/102.2; 702/12

See application file for complete search history.

(56) References Cited

U.S. PATENT DOCUMENTS 3,892,653 A   7/1975   Pacheco 4,346,604 A * 8/1982 Snook et al. ............. 73/861.12
5,394,339 A * 2/1995 Jones ........................ 702/12
2007/0164737 A1* 7/2007 Pusiol ....................... 324/306

FOREIGN PATENT DOCUMENTS

| JP | 2006-263615 | 10/2006 |
| KR | 2001-0111285 | 12/2001 |
| KR | 10-2005-0042216 | 5/2005 |

OTHER PUBLICATIONS

Office Action mailed on Jul. 30, 2008 and issued in corresponding Korean Patent Application No. 10-2007-0040539.

* cited by examiner

*Primary Examiner*—Jewel Thompson

(57) ABSTRACT

A fluid production computation apparatus using the electromagnetic induction theory is disclosed. In accordance with an embodiment of the present invention, the fluid production computation apparatus includes a line through which a current flows according to fluid production; a magnetic sensor, measuring magnetism induced by the current; and a fluid production computation unit, computing the fluid production through magnetism measured by the magnetic sensor. The conventional flow measurement apparatus measures the flow by measuring a current or a voltage induced by magnetism formed by a fluid or by using a fluid measurement sensor. However, with the present invention, an apparatus can be miniaturized and the measurement can be precisely performed by measuring a magnetic field induced by a current flowing according to fluid production.

13 Claims, 5 Drawing Sheets

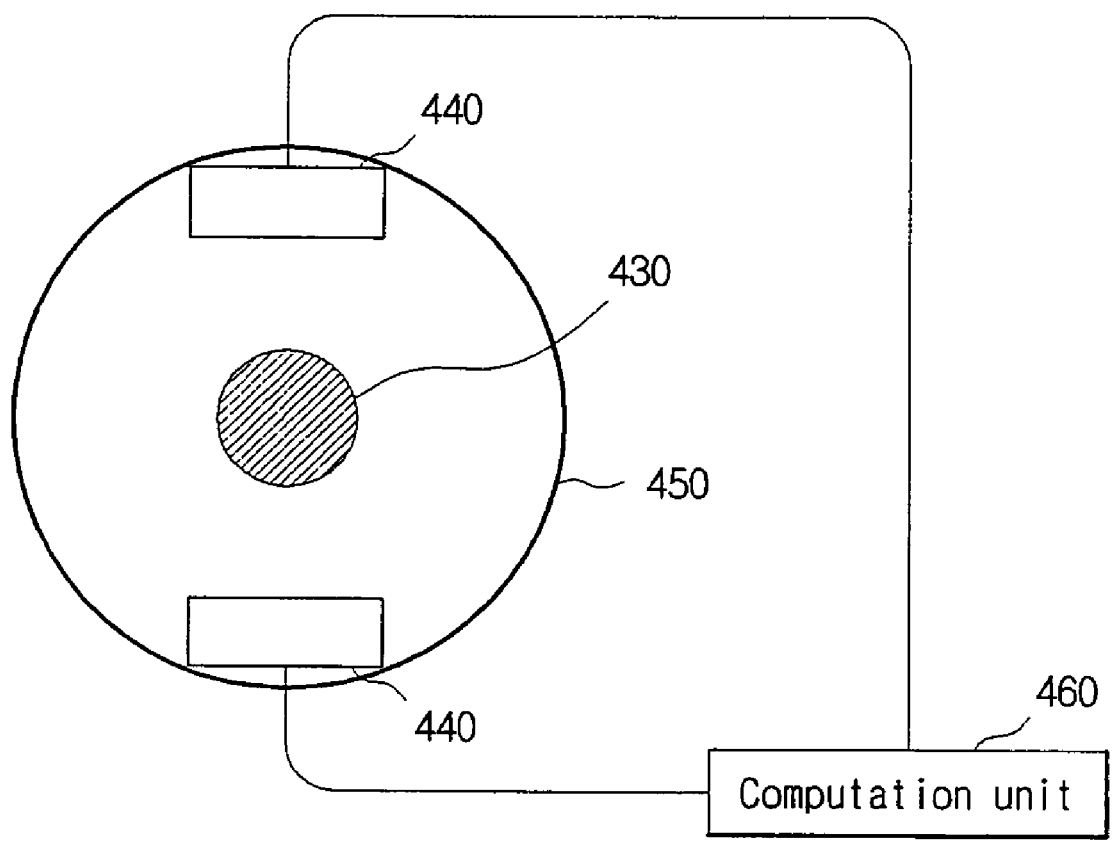

FLUID PRODUCTION COMPUTATION APPARATUS USING ELECTROMAGNETIC INDUCTION THEORY AND FLUID PRODUCING APPARATUS CAPABLE OF COMPUTING FLUID PRODUCTION

CROSS-REFERENCE TO RELATED PATENT APPLICATIONS

This application claims the benefit of Korean Patent Application No. 10-2007-0040539, filed on Apr. 25, 2007, in the Korean Intellectual Property Office, the disclosure of which is incorporated herein in its entirety by reference.

BACKGROUND OF THE INVENTION

1. Field of the Invention

The present invention relates to a flow measurement apparatus, more specifically to a fluid production computation apparatus that computes fluid production by measuring a magnetic filed induced by a current flowing according to a produced fluid.

2. Background Art

A conventional flow measurement apparatus measuring fluid production can be approximately divided into two types. A first type flow measurement apparatus measures the flow by transforming the magnetism, formed by a fluid flowing through a pipe, to an electric signal. In other words, the first type flow measurement apparatus measures the flow based on a current or a voltage induced by the change of a magnetic filed, which is formed by the fluid flowing through the pipe. However, since this flow measurement method can be performed in the only case that the fluid flows through the pipe, if the pipe through which the fluid flows is blocked or leaks, the fluid production is unable to be exactly measured.

A second type flow measurement apparatus measures the flow by mounting a flow sensor in the pipe through which the fluid flows. In other words, the second type flow measurement apparatus acquires a flow value measured by a sensor, directly measuring the flow, mounted in the pipe through which the fluid flows. However, the second type flow measurement apparatus is unable to be used in a small sized apparatus such as a portable apparatus.

SUMMARY OF THE INVENTION

Accordingly, the present invention provides a fluid production computation apparatus that can compute fluid production by measuring a magnetic filed induced by a current flowing according to a produced fluid.

The present invention also provides a fluid production computation apparatus that can be miniaturized by measuring magnetism produced by a current instead of mounting a flow measurement sensor in a fluid transfer path.

In addition, the present invention provides a fluid production computation apparatus that can be manufactured at a low price because it is possible to integrate a current later by using the electromagnetic property.

An aspect of the present invention features a fluid production computation apparatus that computes fluid production by measuring a magnetic filed induced by a current flowing according to the fluid production.

According to an embodiment of the present invention, the fluid production computation apparatus can include a line through which a current flows according to fluid production; a magnetic sensor, measuring magnetism induced by the current; and a fluid production computation unit, computing the fluid production through magnetism measured by the magnetic sensor. At this time, the fluid production computation apparatus can further include a passivation film for preventing magnetism, formed about the line, from being distorted. The magnetic sensor can be arranged according to a direction of magnetism induced by the current flowing through the line.

Another aspect of the present invention features a fluid production computation apparatus that computes fluid production by measuring a magnetic filed induced by a current flowing according to the fluid production.

According to an embodiment of the present invention, the fluid producing apparatus can include an electrolytic cell, including an electrolyte aqueous solution; a first electrode, placed in the electrolytic cell, put in the electrolyte aqueous solution and releasing an electron; a second electrode, placed in the electrolytic cell, put in the electrolyte aqueous solution and receiving the electron to produce a fluid; a line, connecting the first electrode to the second electrode to allow the electron to move through the line; a magnetic sensor, measuring magnetism induced by a current produced by the moving electron; and a fluid production computation unit, computing the fluid production through magnetism measured by the magnetic sensor.

At this time, the fluid producing apparatus can further include a control unit, adjusting an electron movement amount of the line by comparing the computed fluid production with an inputted target amount.

The first electrode can be made of a metal having relatively larger ionization tendency than the second electrode. Hydrogen can be produced in the second electrode.

The magnetic sensor can be arranged according to a direction of magnetism induced by the current flowing through the line.

BRIEF DESCRIPTION OF THE DRAWINGS

These and other features, aspects and advantages of the present invention will become better understood with regard to the following description, appended claims and accompanying drawings where:

FIG. 4B is a front side view showing a fluid production computation apparatus in accordance with an embodiment of the present invention.

DESCRIPTION OF THE EMBODIMENTS

Figure 1:
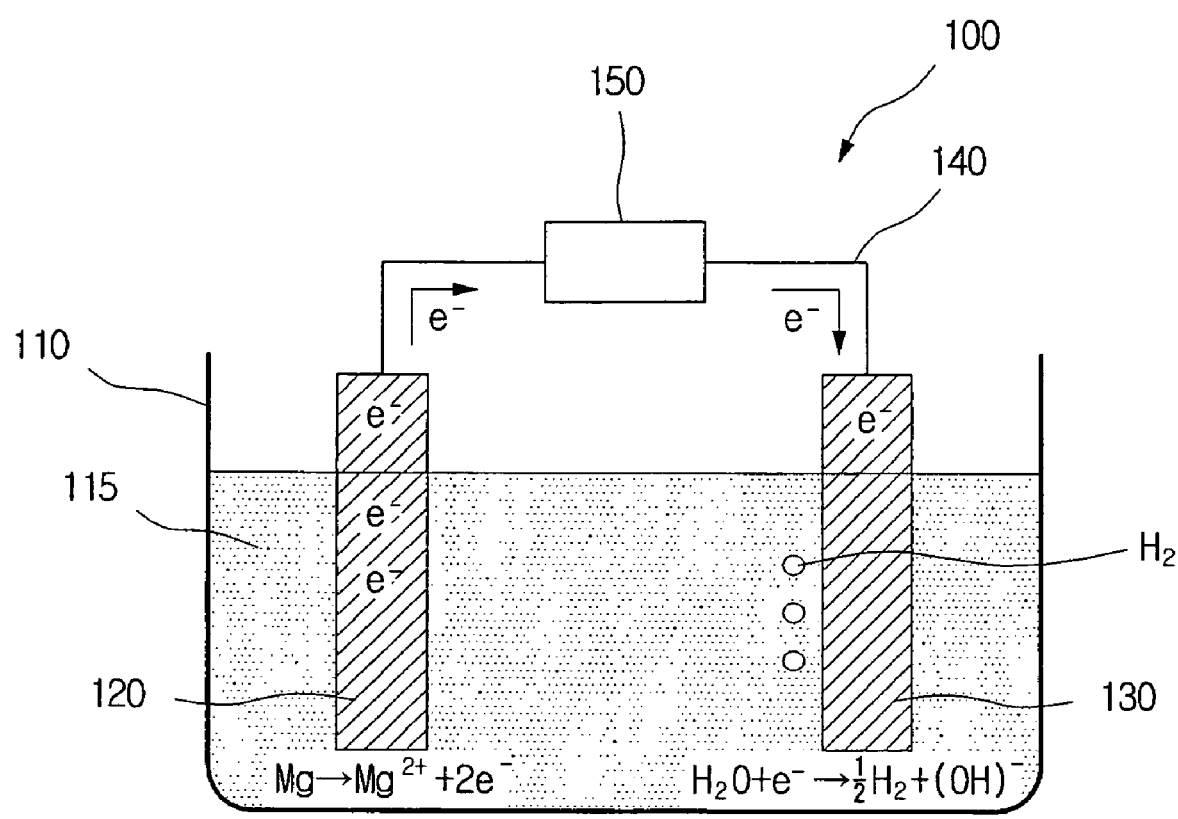
FIG. 1 is a sectional view showing a fluid producing apparatus including a fluid production computation unit in accordance with an embodiment of the present invention.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. Throughout the drawings, similar elements are given similar reference numerals. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other. For instance, the first element can be named the second element, and vice versa, without departing the scope of claims of the present invention. The term "and/or" shall include the combination of a plurality of listed items or any of the plurality of listed items.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Unless otherwise defined, all terms, including technical terms and scientific terms, used herein have the same meaning as how they are generally understood by those of ordinary skill in the art to which the invention pertains. Any term that is defined in a general dictionary shall be construed to have the same meaning in the context of the relevant art, and, unless otherwise defined explicitly, shall not be interpreted to have an idealistic or excessively formalistic meaning.

Hereinafter, some embodiments of the present invention will be described in detail with reference to the accompanying drawings.

FIG. 1 is a sectional view showing a fluid producing apparatus including a fluid production computation unit in accordance with an embodiment of the present invention. The fluid producing apparatus 100 can include an electrolytic cell 110, a first electrode 120, a second electrode 130, a line 140 and a fluid production computation apparatus 150. In the present invention, the fluid can include a liquid type and a gas type. However, the below description is based on the case that the first and second electrodes 120 and 130 are made of magnesium and stainless steel, respectively, and at this time, a hydrogen gas $H_2$ is produced, for the convenience of understanding and description.

The electrolytic cell 110 can include an electrolyte aqueous solution 115. The electrolyte aqueous solution 115 can include an ion. The fluid producing apparatus 100 can product a hydrogen gas by using the ion included in the electrolyte aqueous solution 115. For example, as shown in FIG. 1, the electrolyte aqueous solution 115, which includes a hydrogen ion, can produce a hydrogen gas $H_2$ later by using the hydrogen ion.

In the electrolyte aqueous solution 115, LiCl, KCl, NaCl, $KNO_3$, $NaNO_3$, $CaCl_2$, $MgCl_2$, $K_2SO_4$, $Na_2SO_4$, $MgSO_4$ and/or AgCl can be used as an electrolyte.

Also, the electrolytic cell 110 can include a first electrode 120 and a second electrode 130, each entire or partial area of which is put in the electrolyte aqueous solution 115.

The first electrode 120 can be an active electrode. In the first electrode 120, due to the difference in an ionization energy between a magnesium (Mg) electrode and water ($H_2O$), the magnesium (Mg) electrode can release two electrons ($e^-$) and be oxidized into a magnesium ion ($Mg^{2+}$). At this time, the released electrons can move to the second electrode 130 through the line 140 and the fluid production computation apparatus 150.

The second electrode 130 can be a non-active electrode. In the second electrode 130, the water can receive the electron released from the first electrode and be decomposed into the hydrogen.

In accordance with an embodiment of the present invention, the first electrode 120 can be made of a metal, having a relatively larger ionization tendency, such as alkaline metal groups, for example, aluminum (Al) and zinc (Zn) and iron (Fe) as well as magnesium. The second electrode 130 can be made of a metal, having relatively smaller ionization tendency, such as platinum (Pt), aluminum (Al), copper (Cu), gold (Au), silver (Ag) and iron (Fe) as well as stainless steel, as compared with the metal of the first the electrode 120.

The forgoing chemical reactions can be summarized as the following chemical equation 1.

First electrode 120: $Mg \rightarrow Mg^{2+} + 2e^-$

Second electrode 130: $2H_2O + 2e^- \rightarrow H_2 + 2(OH)^-$

Total reaction: $Mg + 2H_2O \rightarrow Mg(OH)_2 + H_2$      [Chemical equation 1]

In the aforementioned chemical reactions, the reaction speed and the reaction efficiency can be determined by various factors. The factors determining the reaction speed can be area size of the first and/or second electrodes, concentration of the electrolyte aqueous solution 115, type of the electrolyte aqueous solution 115, number of the first and/or second electrodes, connection type of the first and/or second electrodes and electrical resistance of the first and/or second electrodes.

If the foresaid factors are changed, the amount (i.e. the amount of electrons) of a current flowing through the line 140 between the first electrode 120 and the second electrode 130 can be changed depending on the reaction states, which results in the change of the electrochemical reaction (e.g. the chemical equation 1) speed. The change of the electrochemical reaction speed can cause the amount of hydrogen produced in the second electrode 130 to be changed. In other words, the produced fluid amount can be changed according to the current amount flowing through the line 140.

This can be theoretically represented as the Faraday's law as shown in the following formula 1.

$$N_{hydrogen} = \frac{i}{nE} \quad \text{[Formula 1]}$$
$$N_{hydrogen} = \frac{i}{2 \times 96485}$$
$$N_{hydrogen} = \frac{i}{2 \times 96485} \times 60 \times 22400 (ml/min)$$

Here, $N_{hydrogen}$ denotes the amount (mol) of hydrogen produced per 1 second, and $V_{hydrogen}$ denotes the volume (ml/min) of hydrogen produced per 1 second. i, n and E refers to current (C/s), number of reacted electrons and charge per 1 mol of electrons, respectively.

Referring to the chemical equation 1, since two hydrogen electrons is reacted in the second electrode 130, n is 2 and the charge of 1 mol of electrons is about (−)96485 coulomb.

The volume of hydrogen produced during 1 minute can be evaluated by multiplying the amount of hydrogen produced during 1 minute by the volume of 1 mol of hydrogen (i.e. 22,400 ml).

The present invention relates to an apparatus measuring a generation amount of a fluid by using the foresaid relationship between the amount of a current, flowing through the line 140, between the first electrode 120 and the second electrode 130, and the amount of the generated hydrogen. Below will be described the corresponding principle.

The fluid production computation apparatus 150, which is located on the line 140, can include a fluid production computation unit. The fluid production computation apparatus 150 can compute fluid production by evaluating a value of a magnetic field induced by a current flowing through the line 140.

In accordance with an embodiment of the present invention, the fluid producing apparatus 100 can further include a control unit. The control unit can control a movement amount of the electrons flowing through the line 140, which is the current, by comparing the fluid production and the target amount inputted by a user. At this time, the control unit can finally control fluid production by including the fluid production computation apparatus 150 or by being connected to the fluid production computation apparatus 150 to adjust the current amount. In accordance with an embodiment of the present invention, the fluid producing apparatus 100 can locate the control unit on the line 140 connecting the first electrode 120 to the second electrode 130, to thereby control the electrical resistance of the first electrode 120 and the second electrode 130. In other words, changing the electrical resistance between the first electrode 120 and the second electrode 130 based on the forgoing the formula 1 can result in the adjustment of the size of the current flowing between the first electrode 120 and the second electrode 130, to thereby produce the fluid as much as necessary.

Hereinafter, the relationship between the amount of a current flowing between the first electrode 120 and the second electrode 130 and the produced fluid amount (e.g. hydrogen gas in the embodiment) in the fluid production unit 100 in accordance with an embodiment of the present invention will be described with reference to FIG. 2.

Figure 2:
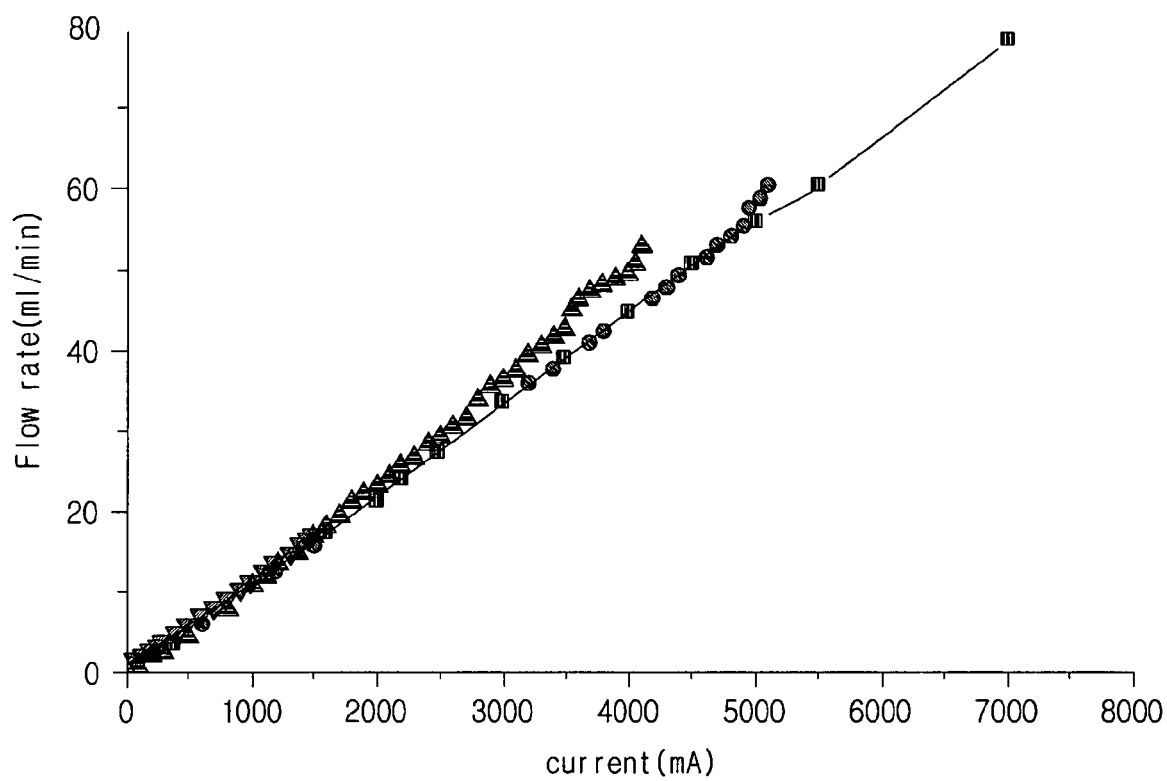
FIG. 2 is a graph showing the relationship between a current amount and a produced hydrogen gas amount.

FIG. 2 is a graph showing the relationship between a current amount and a produced hydrogen gas amount. Here, the produced hydrogen gas amount can refer to a flow rate computed every 1 minute.

Referring to the graph of FIG. 2, it can be recognized that the flow (ml/min) of the produced hydrogen is determined according to the amount of the current flowing through the line 140 connected between the first electrode 120 and the second electrode 130. In other words, the increase of the current value of the x-axis can cause the flow (ml/min) of hydrogen produced during 1 minute to be increased together. It can be also recognized that the graph has the linear property. In accordance with an embodiment of the present invention, the fluid production computation apparatus 150 can uses the linear property, which means that the current amount and the production (ml/min) of hydrogen during a unit time are in direct proportion. In other words, when the magnetic field induced by the current is measured, since the current and the magnetic field value are also in direct proportion, the fluid production can be evaluated through the magnetic field value.

Hereinafter, the method of measuring fluid production by using a magnetic field induced by a current flowing through a line 340 will be in detail described with reference to FIG. 3.

Figure 3:
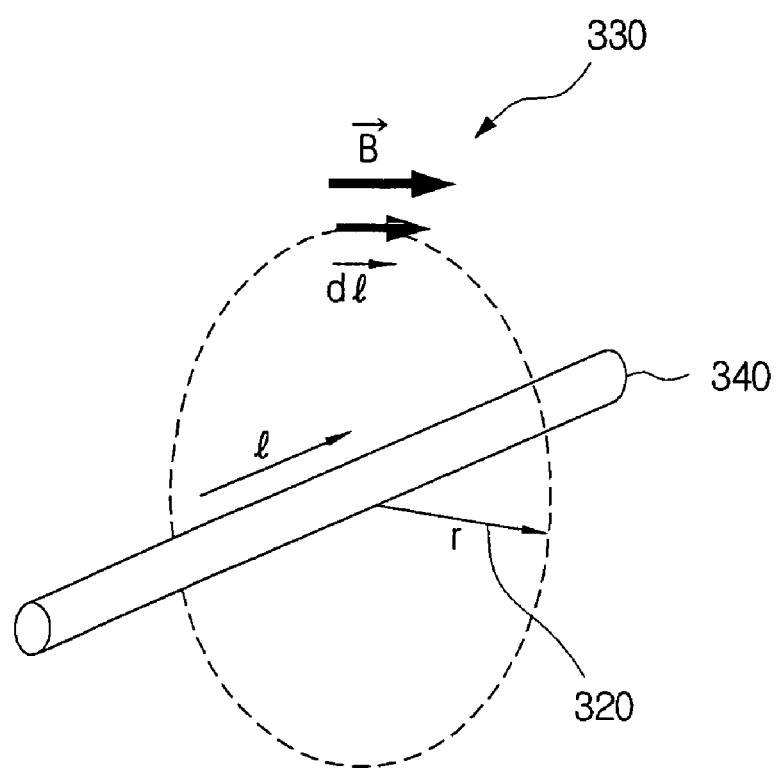
FIG. 3 is an example showing directions of a current and an induced magnetic filed in case that the current flows through a line in accordance to an embodiment of the present invention.

FIG. 3 is an example showing directions of a current and an induced magnetic filed in case that the current flows through the line 340 in accordance to an embodiment of the present invention.

If a current 310 flows in the direction of the arrow illustrated in FIG. 3, a magnetic field 330 is formed about the line 340 by the right hand grip rule. In particular, If the direction in which the current 310 flows is adjusted to be the same direction as the thumb and the line 340 in which the current 310 flows is gripped by the remaining 4 fingers, the magnetic field 330 can be formed in the direction gripped by the fingers. At this time, the formed magnetic field 330 can be formed in a ring shape about the line 340.

Hereinafter, the method of measuring fluid production by using the magnetic field 330 induced by the current 310 will be described.

Firstly, the Ampere's law, which shows the relationship between a current and a magnetic field, will be described before the description related to the measuring method. The Ampere's law shows that the amount of work necessary to allow a unit stimulus to go around a certain path in a magnetic field induced by a current is in proportion to the total current penetrating a surface, the edge of which is the path. Accordingly, when a current I flows through a long straight line, the relationship between an induced magnetic field and the current I will be described based on the above description.

$$\oint B \cdot dl = \mu_0 I \qquad \text{[Formula 2]}$$

The Ampere's law can be represented as the formula 2. Here, B, I, $\mu_0$ and d1 refer to a magnetic field, a current, the permeability under a vacuum and a length of unit path. The formula 2 can be expanded as the following formula 3.

$$\oint B \cdot dl = \oint B dl = B \oint dl = B[2\pi r] = \mu_0 I \qquad \text{[Formula 3]}$$

$$B(r) = \frac{\mu_0 I}{2\pi r}$$

Through the formula 3, the magnetic field can be induced as $$B(r) = \frac{\mu_0 I}{2\pi r}.$$

At this time, the permeability under the vacuum $\mu_0$ can be represented as $\mu_0 = 4\pi \times 10^{-7}$(Tm/A), and r 320 refers to the radius between the line 340 through which the current flows and the magnetic field 330 induced about the line 340 in the ring shape. Through this, the present invention can compute the produced fluid amount by using the following formula 4.

$$FH = A \times B(r) \qquad \text{[Formula 4]}$$

The produced fluid amount FH is in proportion to the magnetic field B(r) induced from the formula 3. At this time, A is a proportion constant. The reason that the proportion relationship is induced can be because since the fluid production is in proportion to the current amount as described above and the magnetic field is also in proportion to the current as described with reference to FIG. 3, the fluid production can be in proportion to the magnetic field. In other words, if the r 320 between the line 340 and the position where the magnetic field is measured is a constant, the remaining $$\frac{\mu_0}{2\pi r},$$

excluding the current I from $$B(r) = \frac{\mu_0 I}{2\pi r},$$

can also be a constant. Similarly, since the current and the fluid production are also in linear proportion as shown in FIG. 2, the formula 4 can be induced.

Here, since the reaction level may be changed due to the surrounding temperature of the fluid production computation apparatus 150 and the contact resistance between the electrode and the line, the formula 4 can be represented as the following formula 5.

$$FH = A \times B(r) + C \quad \text{[Formula 5]}$$

At this time, A is a proportion constant and C is a constant considering the reaction affected by the external environments. The A and C, which are defined as real numbers, can be evaluated as experimental values, respectively.

The present invention relates to the apparatus of computing the fluid production through the formula 2 through the formula 5. While the conventional art computes the fluid production by measuring a current or a voltage induced according to the change of a magnetic field formed by the flow of a fluid, the present invention computes the fluid production by measuring a magnetic field induced by a current flowing according to the fluid production. Also, this can use the principle that the fluid production is in proportion to the current by as the Faraday's law as shown in the following formula 1.

Figure 4A:
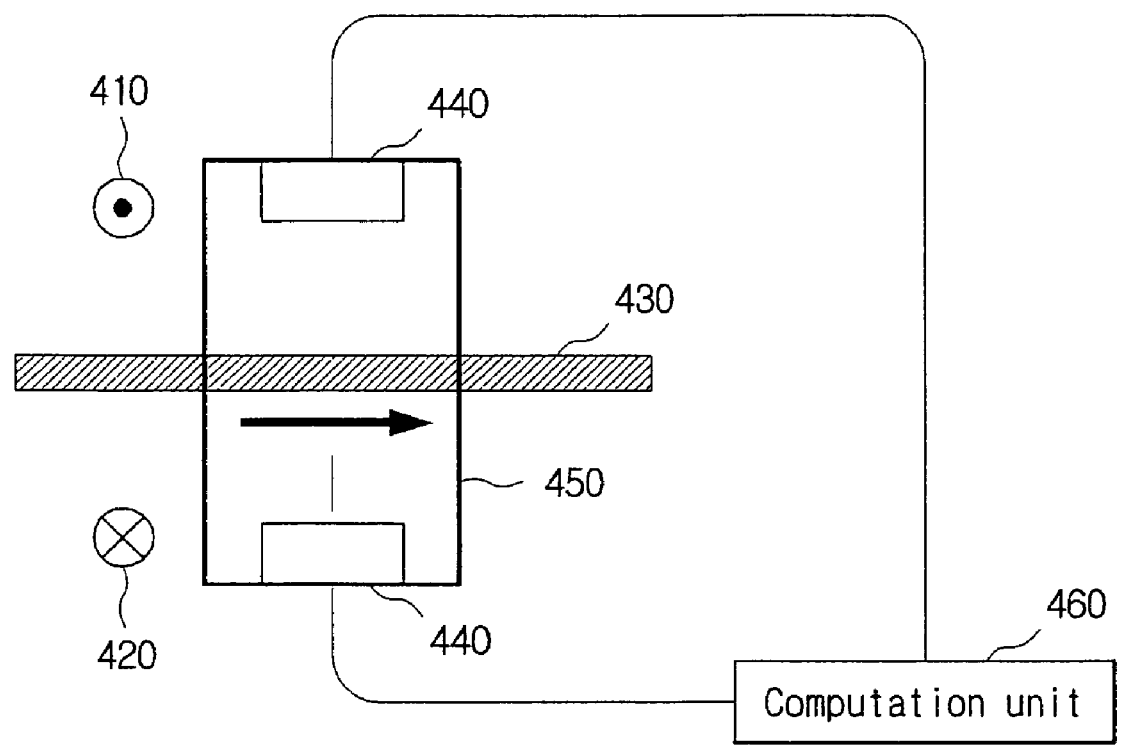
FIG. 4A is a literal side view showing a fluid production computation apparatus in accordance with an embodiment of the present invention.

Hereinafter, the structure of the fluid production computation apparatus and the structure of a passivation film for removing distorted magnetism in accordance with an embodiment of the present invention will be described with reference to FIG. 4A and FIG. 4B. FIG. 4A is a literal side view showing a fluid production computation apparatus in accordance with an embodiment of the present invention, and FIG. 4B is a front side view showing a fluid production computation apparatus in accordance with an embodiment of the present invention.

In FIG. 4A, if a current is assumed to flow through a line 430 in a direction of a right side, the directions 410 and 420 of a magnetic field can be determined according to the foresaid Ampere's right hand grip rule. In particular, If the direction in which the current flows is adjusted to be the same direction as the thumb and the line 430 in which the current flows is gripped by the remaining 4 fingers, the magnetic field can be formed in the direction gripped by the fingers. Accordingly, as illustrated in FIG. 2, while the magnetic field 410 can have the direction penetrating from the back surface to the front surface of the paper drawn with FIG. 4A in an upper part of the line 430, the magnetic field 420 can have the direction penetrating from the front surface to the back surface in a lower part of the line 430. A magnetic sensor 440 is placed in a ring shape in the same direction as the magnetic field formed about the line 430. Particularly, at least one magnetic sensor 440 is arranged in the ring shape at a distance about the line 430. Since the magnetic sensor 440 senses the magnetic field induced by the current through the line 430, sensing exactly the induced magnetic field can need to arrange the magnetic sensor 440 in the same direction as the magnetic field direction. Also, although FIG. 4A is the literal side view in the case of two magnetic sensors 440, at least one magnetic sensor can be placed in accordance an embodiment of the present invention. However, it is evident to any person of ordinary skill in the art that more magnetic sensors can make it exact and without errors to measure the magnetic field The magnetic sensor 440 can be connected to a fluid production computation unit 460. The fluid production computation unit 460 can compute the fluid production by using the magnetic field value, measured by the magnetic sensor 440, and the formula 5. In other words, the fluid production computation unit 460 can compute the amount of hydrogen produced during 1 minute by measuring the magnetic field by use of the magnetic sensor 440 based on the relationship between the magnetic field and the hydrogen production.

At this time, the fluid production computation apparatus can further include a passivation film 450 for preventing the magnetic field measurement value of the magnetic sensor 440 to be distorted as described above. In accordance with an embodiment of the present invention, the passivation film 450 can be placed about the line 430 in a ring shape enveloping the magnetic sensor 440. The passivation film 450, which is to prevent the magnetic sensor 440 from being affected by an external magnetic field, can be made of any material allowing magnetism not to be penetrated. This is because even though the constant for correcting the external environments is applied like the formula 5, the external magnetism may affect the magnetic field induced by the line 430, to be distorted. The external magnetism may be terrestrial magnetism, magnetism induced by the electronic apparatus and magnetism induced by a magnetic substance.

Further, the passivation film 450 can function as settling the positions of the magnetic sensors 440 in addition to preventing the affect of the external magnetism.

FIG. 4B is a front side view showing the magnetic sensor 440 and the passivation film 450 of the fluid production computation apparatus. Referring to FIG. 4B, it can be recognized that the magnetic sensor 440 is placed about the line 430 and the passivation film 450 envelops the magnetic sensor 440. The magnetic sensor 440 and the pasivation film 450 can help measure exactly the magnetic field value without being distorted. Based on this, the fluid production computation unit 460 can compute the fluid production.

What is claimed is:

1. A fluid production computation apparatus, comprising:
   a line through which a current flows according to fluid production;
   a magnetic sensor, measuring magnetism induced by the current; and
   a fluid production computation unit, computing the fluid production through magnetism measured by the magnetic sensor.

2. The apparatus of claim 1, further comprising a passivation film for preventing magnetism, formed about the line, from being distorted.

3. The apparatus of claim 1, wherein at least one magnetic sensor is provided.

4. The apparatus of claim 3, wherein the magnetic sensor is arranged according to a direction of magnetism induced by the current flowing through the line.

5. The apparatus of claim 4, wherein the magnetic sensor is arranged in a ring shape about the line.

6. A fluid producing apparatus capable of computing fluid production, comprising:
   an electrolytic cell, including an electrolyte aqueous solution;
   a first electrode, placed in the electrolytic cell, put in the electrolyte aqueous solution and releasing an electron;
   a second electrode, placed in the electrolytic cell, put in the electrolyte aqueous solution and receiving the electron to produce a fluid;
   a line, connecting the first electrode to the second electrode to allow the electron to move through the line;

a magnetic sensor, measuring magnetism induced by a current produced by the moving electron; and a fluid production computation unit, computing the fluid production through magnetism measured by the magnetic sensor.

7. The apparatus of claim 6, further comprising a control unit, adjusting an electron movement amount of the line by comparing the computed fluid production with an inputted target amount.

8. The apparatus of claim 6, wherein further comprising a passivation film for preventing magnetism, formed about the line, from being distorted 9. The apparatus of claim 6, wherein the first electrode is made of a metal having relatively larger ionization tendency than the second electrode.

10. The apparatus of claim 6, wherein hydrogen is produced in the second electrode.

11. The apparatus of claim 6, wherein at least one magnetic sensor is provided.

12. The apparatus of claim 11, wherein the magnetic sensor is arranged according to a direction of magnetism induced by the current flowing through the line.

13. The apparatus of claim 12, wherein the magnetic sensor is arranged in a ring shape about the line.

* * * * *